(12) United States Patent
Sleytr et al.

(10) Patent No.: US 6,296,700 B1
(45) Date of Patent: Oct. 2, 2001

(54) METHOD OF PRODUCING A STRUCTURED LAYER

(75) Inventors: Uwe B. Sleytr; Dietmar Pum; Hans Loschner, all of Vienna (AT)

(73) Assignee: IMS-Ionen Mikrofabrikations Systems GmbH, Vienna (AT)

( * ) Notice: Subject to any disclaimer, the term of this patent is extended or adjusted under 35 U.S.C. 154(b) by 0 days.

(21) Appl. No.: 09/388,289

(22) Filed: Sep. 1, 1999

Related U.S. Application Data

(63) Continuation-in-part of application No. PCT/AT98/00050, filed on Mar. 4, 1998.

(30) Foreign Application Priority Data

Mar. 4, 1997 (AT) .......................................................... 373/97

(51) Int. Cl.$^7$ .................................................. C30B 29/54
(52) U.S. Cl. ................................ 117/84; 117/5; 117/925; 117/927
(58) Field of Search .................................. 117/925, 927, 117/84, 5

(56) References Cited

U.S. PATENT DOCUMENTS 4,728,591 * 3/1988 Clark et al. ............................... 430/5

* cited by examiner

*Primary Examiner*—Robert Kunemund
(74) *Attorney, Agent, or Firm*—Thomas R. Vigil

(57) ABSTRACT

The invention relates to a method for producing a structured layer of defined functional molecules on the surface of a flat substrate, on the surface of which structures having different surface properties, at least as regards their hydrophobicity, are produced. A monolayer of a protein-containing crystalline cell surface layer (S layer) is deposited by recrystallization on said structured surface. Said S Layer binds only to those structured areas of the surface characterized by raised hydrophobicity. Alternatively, a structured S-layer may also be produced on the basis of a monolayer of an S layer deposited on a substrate by irradiating predefined sections of said layer to be structured with radiation of a predetermined intensity and energy. In the irradiated sections of the S-layer this suppresses the binding or intercalating ability of at least one surface. Functional molecules can bind to or become intercalated in the surface or the intermediate spaces of the crystal lattice, for example for use as bio-sensors.

5 Claims, 7 Drawing Sheets

Figure 4A:
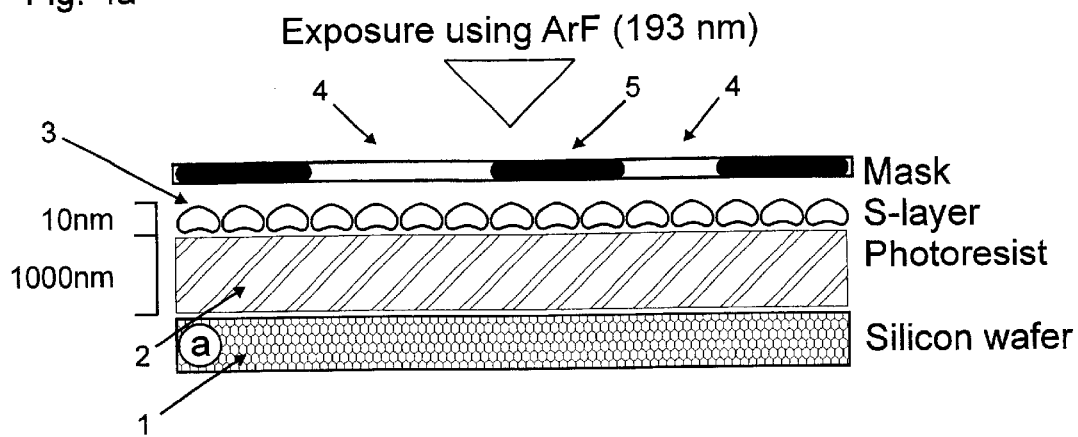

Reactive ion etching of the modified S-layer regions and the organic base layer Fig. 1a: Application of the S-layer onto an organic base layer planarizing the wafer topography
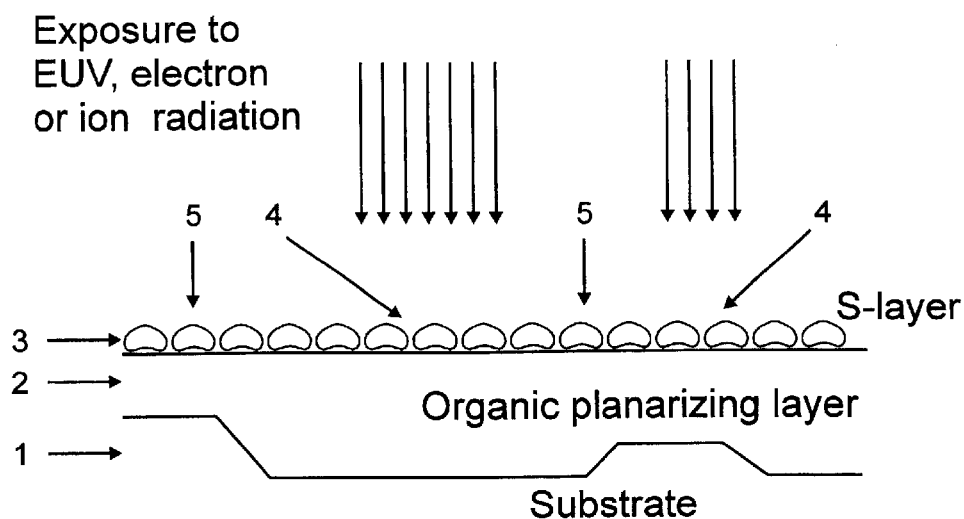
Fig. 1b: Modification of the S-layer in the irradiated regions
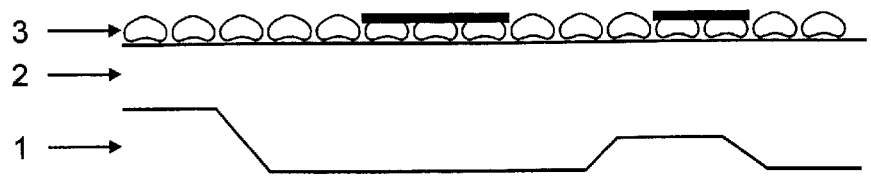

Fig. 1c: Selective deposition of a complementary S-layer
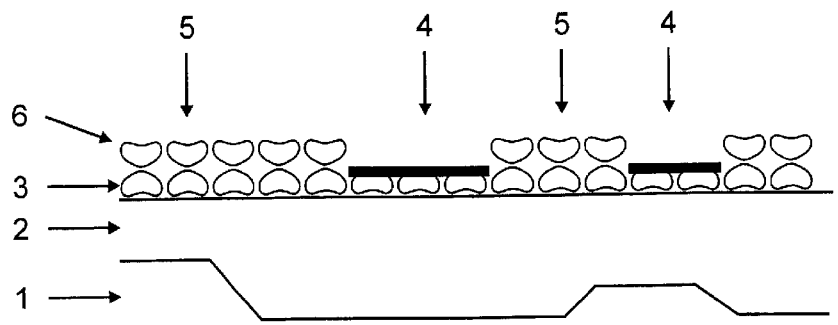
Fig. 1d: Deposition of structure reinforcing ligands
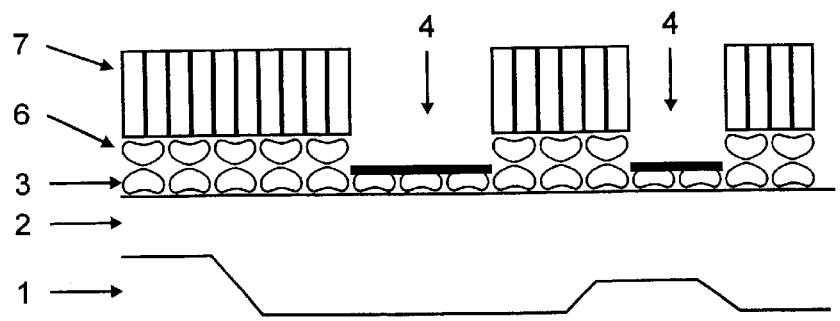
Fig. 1e: Reactive ion etching of the modified S-layer regions and the organic base layer
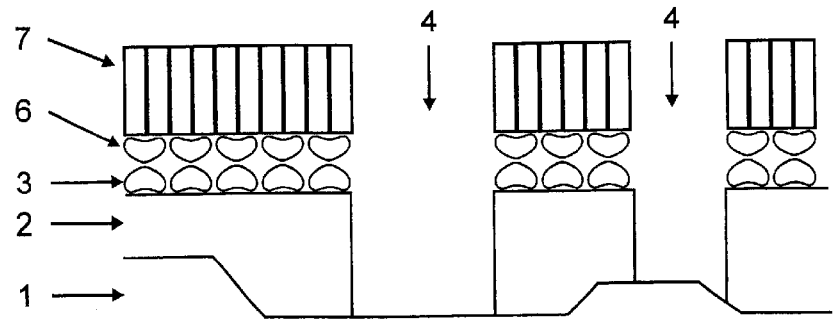

Fig. 2a: Selective deposition and reinforcement of metal layers
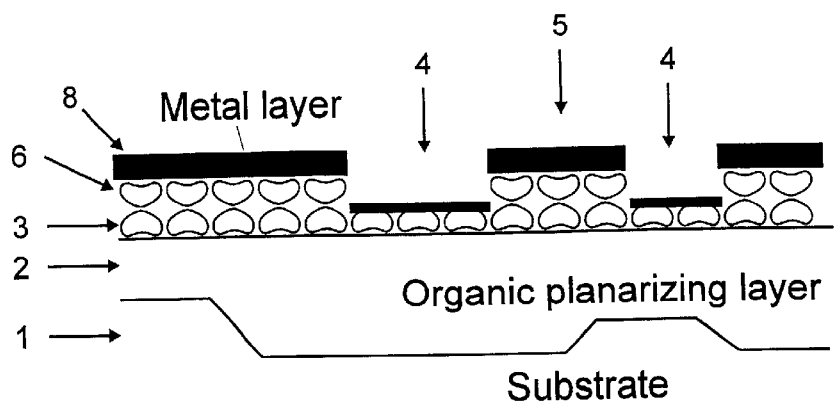
Fig. 2b: Dry developing by means of metallic masking
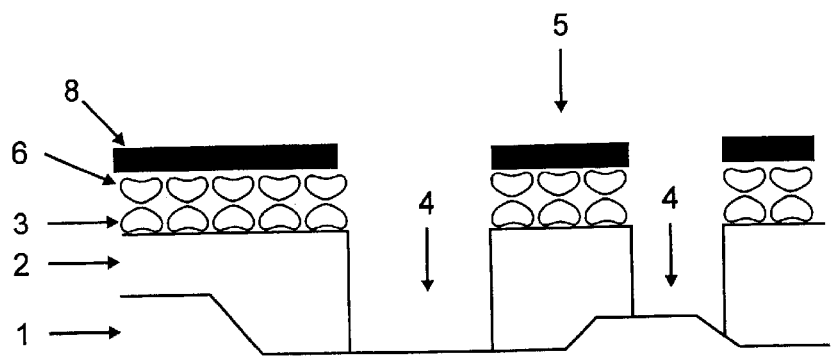

Fig. 3: S-layer as conformable resist material
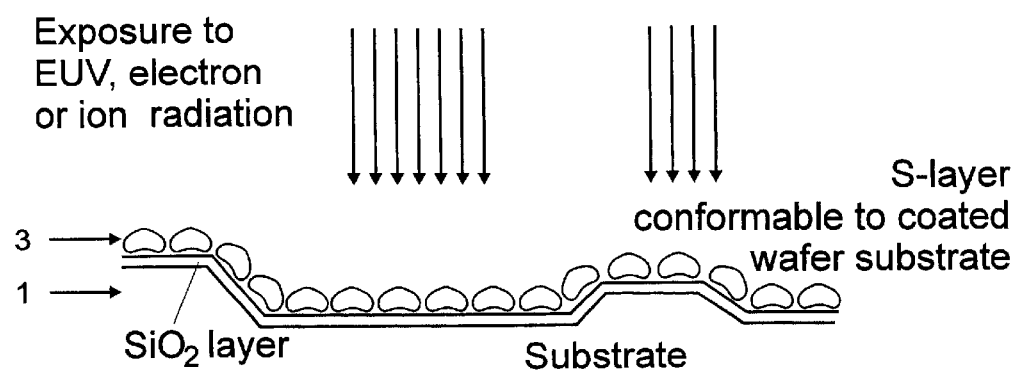

"Exposing" using ion radiation or writing using electron beam

Semiconductor substrate with S-layer

Immobilization of functional molecules on the non-irradiated regions

METHOD OF PRODUCING A STRUCTURED LAYER

This application is continuation-in-part of international application number PCT/AT98/00050 filed Mar. 4, 1998 (status, abandoned, pending, etc.).

The present invention relates to a method of producing a structured layer of defined functional molecules on the upper face of a basically substantially flat sheet substrate. For this purpose, the substrate is covered with a monolayer of crystalline cell surface layer (S-layer) containing protein deposited by recrystallisation.

The production of recrystallised S-layers from crystalline cell surface protein layers (bacterial surfaces) on a solid or liquid substrate is known. For example, the fabrication of multilayered S-layers from prokaryotic cells and their application as ultra-filtration membranes has been thoroughly described in EP-B1 154 620. At the present time there are about 400–600 known bacterial species whose cell surface layers have crystalline structures. The lattice contents of these structures are in the range of about 3 to 30 nm. By further developing this type of fabrication method it has been possible to create monolayers of S-layers with a two dimensional crystalline structure on sheet-like surfaces, for example silicon wafer. Experiments of this kind and their results are described in the article entitled, "Monomolecular reassembly of crystalline bacterial cell surface layer (S-layer) on untreated and modified silicon surfaces", (D). Pum, U. B. Sleytr), published in Supramolecular Science 2 (1995) 193–197. S-layers crested on silicon wafers can be structured by exposure of the layers to radiation through a contact mask, with UV radiation of a predetermined wavelength, for example 193 nm, which results in the S-layer areas of this layer being exposed to UV radiation being ablated, so that the structure of the mask is imaged to the substrate positioned immediately behind it. For use of these structured S-layers on Si-layers in supramolecular engineering, (Supramolecular Engineering), for example for biosensors, functional molecules are deposited or intercalated on the non-ablated regions of the S-layer remaining on the substrate, and immobilised at a defined spacing and regularity became of the lattice structure of the S-layer. Work of this kind has been described, amongst others, in the publication entitled "Crystalline Bacterial Cell Surface Layers (S-Layers): From Cell Structure to Biomimetics", Prog. Biophys. molec. Biol. Vol. 65, No. 1/2, pp 83–111, 1996.

Experiments of the above kind have similarly been carried out with so-called SAM-layers (Self Assembled Mono Layers). In contrast to S-layers, SAM-layers are formed from elongated lipids, e.g. SH-lipids, which are bound to the surface of a substrate at one end by covalent bonds, and which have a complex function for binding a further SAM-layer or functional molecule at the other, free end. The application of SAM-layers for structured metallisation of a substrate is, for example, described in U.S. Pat. No. 5,079,600 (Schnur et al.). One disadvantage with SAM-layers as opposed to S-layers is, amongst others, that SAM-layers do not have a defined crystalline structure and therefore also no regular base structure for a defined deposition or intercalation of functional molecules, whereas S-layers, due to their strictly ordered lattice structure, facilitate a precisely defined, more or less dense deposition or intercalation of functional molecules. Moreover, with S-layers, access through the pores to the substrate subsequent to coating, for example electrolytic ions, is still possible with S-layers, which is not the case with SAM-layers. An important advantage of S-layers in contrast to SAM-layers is that S-layers can be deposited on a variety of substrates without any problems, e.g. on technologically interesting material types, such as silicon wafers.

The publication "Patterning of Monolayers of Crystalline S-layer Proteins on a Silicon Surface by Deep Ultraviolet Radiation", Microelectronic Engineering 35 (1997) 297–300, describes a method of fabricating a structured layer in which predefined areas of an S-layer which has been deposited on the surface of the substrate or a previously deposited planarising layer are modified by exposure to short-wave UV radiation, and subsequently the S-layer, and, if appropriate, the planarising layer is removed in the exposed areas. An ArF and KrF excimer laser is used for the exposure, in which the S-layer can be completely removed applying a short exposure to ArF radiation, which is however in comparison only minimally affected by KrF radiation even with lengthier exposure. A resist layer positioned below the S-layer is exposed by KrF radiation and imaged, wherein the S-layer acts as a mask for the resist layer. Furthermore this document discloses the option of selective deposition of a complementary S-layer onto the pre-structured S-layer, as well as the reinforcement of the structured S-layer, in order to make this more resistant than with the plasma etch processes, by coupling additional ligands to the S-layer, through the deposition of heavy metal combinations or through electroless deposition of a metal layer.

What is, however, not indicated in the article in Microelectronic Engineering 35 is whether other structuring options, apart from ablation, exist to allow deposition or intercalation of a substance to just the unexposed areas, for example. Nor is it clear from the article what kind of layer the planarising layer is. The article similarly fails to mention the option for fabricating structures with different surface characteristics and leading from this the deposition of an S-layer only in the areas of the surface with increased hydrophobicity.

The latter option is dealt with in the document published within the priority interval entitled "Deep UV pattering of monolayers of crystalline S-layer protein on silicon surfaces", Colloids and Surfaces B, Biointerfaces 8 (1997) 157–162. According to this document, deposition of the S-layer occurs only in the hydrophobic areas of a silicon wafer previously generated by creating a silicon oxide layer, the remaining silicon surface however, remains free.

It is, therefore, an object of the present invention to facilitate the comprehensive technological but cost-effective application of S-layers, and if applicable to exploit the available technology in the field of semiconductor processing.

These aims are met by a method of the type mentioned at the beginning, in that the upper face of the substrate being initially structures are fabricated on the upper surface of the substrate with different surface characteristics at least in relation to their hydrophobicity. A monolayer of protein-containing crystalline cell surface layer (S-layer) can be deposited onto this structured surface by recrystallisation, wherein this S-layer is deposited only on the structured areas of the surface displaying increased hydrophobicity, on account of the unusual quality of the S-layers, so that the structured S-layer automatically aligns itself to the defined structures of the substrate. Subsequently, one (single) sort of functional molecule can be immobilised on the S-layer, for example in order to carry out a sensor function. Functional molecules which are suitable are, e.g., enzymes, antibodies, ligands, or metals (metal clusters). Using the method according to the invention, a variety of sensors and their switching logic can be accommodated into a minimal space as required. The invention thus provides a technologically advantageous method, for example for application in sensor technology.

A simple accomplishment of this method, the surface of a substrate is divided into hydrophobic areas on the one hand, and hydrophobic areas on the other, by coating this substrate and structuring this coating by removing the coating in predefined regions, wherein the subsequent deposition of the S-layer by recrystallisation is performed on the hydrophobic areas. As an example, the substrate can be a silicon wafer with a structured oxide layer, in which the silicon surface can be transferred into a hydrophilic state, for example by using the RCA-cleaning method; whereas the regions with the oxide layer remain in an hydrophobic state and provide for the deposition of the S-layer. Alternatively, instead of a structured layer, the surface of a substrate can be structured into regions with hydrophobic properties and regions with hydrophilic properties by exposure to radiation with defined intensity and energy, e.g. masked ion radiation, wherein the subsequent deposition of the S-layer by recrystallisation is only performed on the hydrophobic areas of the substrate surface. Accordingly, deposition of S-layers for defined material surfaces can be promoted in a simple manner by the selection of suitable radiation to structure the substrate surface, so that creation and patterning of a suitable layer can actually be omitted in these cases.

Figure 4B:
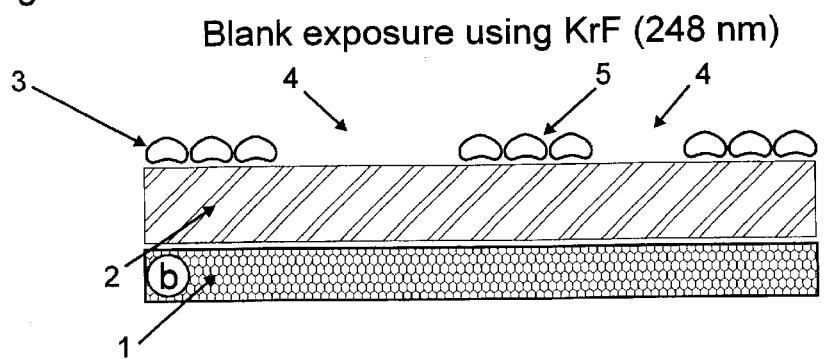
Figure 4C:
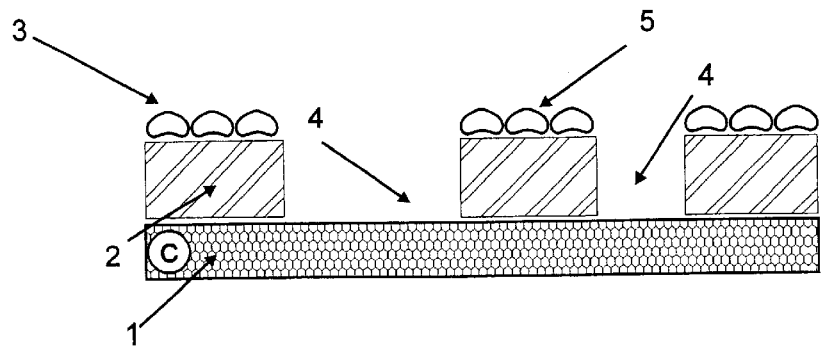
Figure 5A:
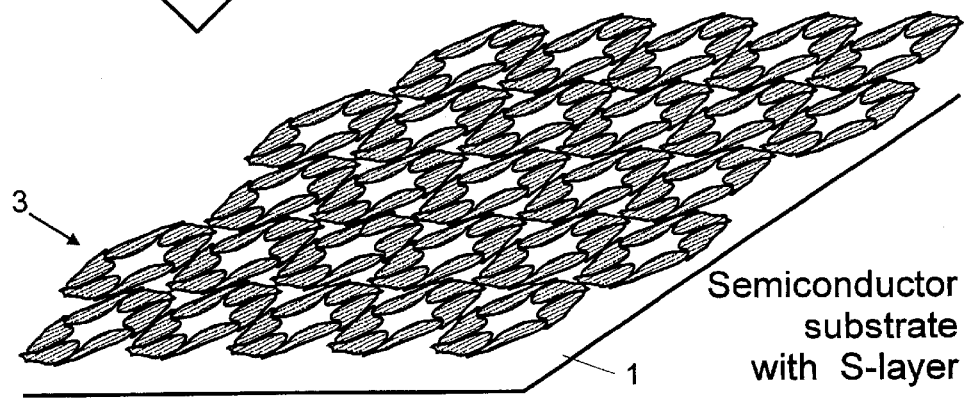
Figure 5B:
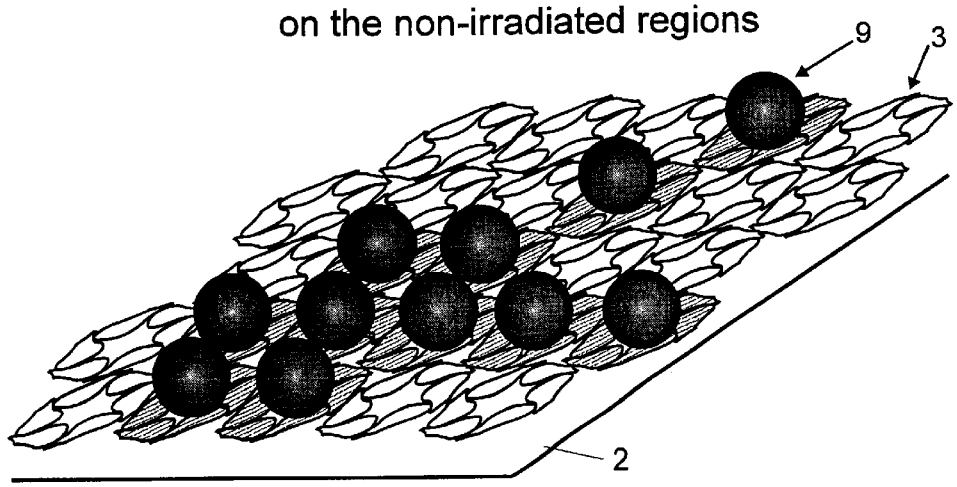
Figure 6A:
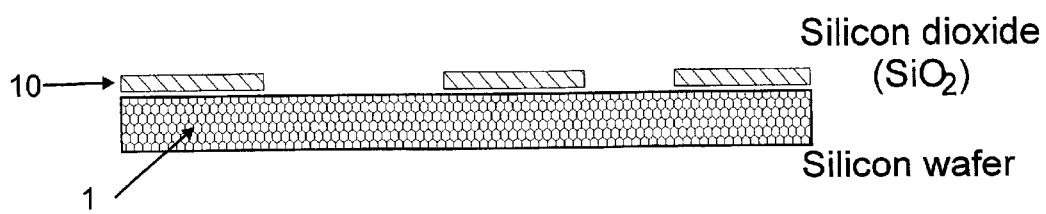
Figure 6B:
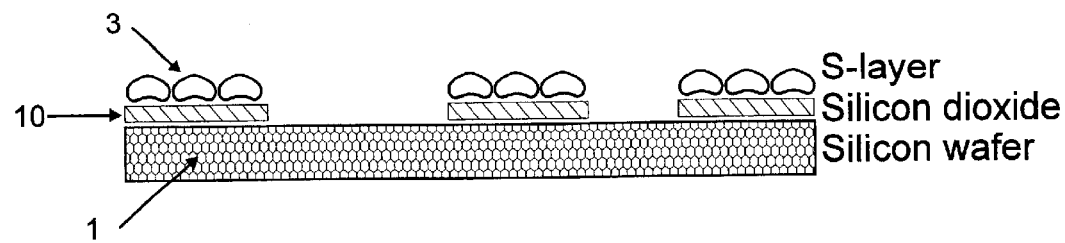

The present invention is described in more detail using several non-restricting embodiment examples referring to the attached drawings, which are as follows:

FIGS. 1a to 1e Individual processing steps of the method for structuring a substrate by means of an S-layer with implementation of a planarising layer;

FIGS. 2a and 2b An embodiment variation of the method in FIG. 1;

FIG. 3 An illustration of the method for structuring a substrate without implementation of planarising layer;

FIGS. 4a to 4c A further embodiment variation of the method of FIG. 1;

FIGS. 5a and 5b An embodiment variation of the method of FIG. 3;

FIGS. 6a and 6b A further embodiment variation of the method according to the invention.

First, reference is made in relation to FIGS. 1a to 1e, in which the individual processing steps of the method for structuring a substrate 1 are depicted. The substrate 1, for example a silicon wafer, has a stepped upper face structure, for example due to previously generated circuit structures. An organic planarising layer 2, for example a resist material, is applied onto top of this stepped structure to smoothly cover the stepped structure and to create as uniform a surface as possible for the fabrication of the S-layer 3. A monolayer 3 of an S-layer substance is deposited onto this surface by recrystallisation. If the planarising layer 2 has a hydrophobic surface, the individual proteins of the S-layer are deposited so that the external face of the original cell surface faces the planarising layer 2, and the open surface on the upper face of the S-layer is formed by the original inner face of the cell surfaces. Methods of depositing S-layers in monolayers are already known to the skilled in the art, including the publications named in the introduction, the publication of which expressly forms part of the content of this application. The individual processing steps for generating an S-layer are therefore not described in detail in this disclosure.

The layer structure produced, comprising substrate 1, planarising layer 2 and S-layer 3, are structured using lithographic methods, e.g. by exposure, particularly to short-wave ultraviolet radiation (DV=Deep UV), electron or ion beams, so that defined regions 4 of the S-layer 3 which are to be structured are affected by the radiation, whereas other regions 5, not to be structured, are not affected. The structuring of surface layers using lithographic methods is already known to the skilled in the art and is likewise not explained in further detail at this point. An important factor in the structuring of S-layers 3 is, however, the energy and intensity of the respective radiation being adjusted so that the S-layer is modified in the exposed areas 4, at least in its affinity to the deposition a defined substance 6, and, if appropriate to a complementary S-layer (cf. FIG. 1c).

An optional processing step is depicted in FIG. 1c, in respect of the deposition of a complementary S-layer 6 in the non modified regions 5 of the S-layer 3. A complementary S-layer is basically an identical S-layer, whereby the inner faces of the original cell surfaces face the inner faces of the original cell surfaces of the existing S-layer, so that the external face of the original cell surface is again available for the upper face of the complementary S-layer. The deposition (reproduction) of S-layer monolayers on substrate surfaces is carried out under precisely defined conditions with relation to temperature, pH value and ionic strength (as described in the literature). If these conditions are altered, very often the forming of complementary S-layers occurs, wherein both S-layers are bonded together in accurately defined orientation (external or inner faces) on account of their anisotropic surface characteristics (Refer to: U. B. Sleytr and P. Messner, in Electron Microscopy of Subcellular Dynamics, (H. Plattner, Ed.) CRC Press, Boca Raton, pages 13–31, 1989). As advantages of a double S-layer, in particular, structural reinforcement and the possibility of generating a denser matrix for deposition or intercalation of a certain substance are seen here.

Structure reinforcing layers, for example $ZrOcl_2$ and $H_4P_2O_7$, may be deposited onto the complementary S-layer (FIG. 1d) using Multilayer Self-Assembly, which in the subsequent reactive-ion etch process, for example in an oxygen plasma, display a comparatively low etching rate (FIG. 1e). In the event that the structure reinforcing layers can also be etched at the inner faces of the original cell surfaces on account of their binding capabilities, then the above described optional processing step in respect of FIG. 1c can be dropped. In the concluding etch processing step shown in FIG. 1e, only the modified area of the S-layer 3, and the area of the planarising layer 2 positioned below it up to the substrate surface, will now be etched due to the masking of the selectively deposited ligands. By using sharp edged thin masking (two monolayers) and the ordered etch process, particularly steep side-walls can be generated at the interfaces of the structures, so that the structures of the S-layer 3, 6 can be reproduced precisely on the substrate.

An alternative variant of the above mentioned process is depicted in FIGS. 2a and 2b, where the processing steps according to FIGS. 1a, 1b and 1c are carried out in advance of these steps.

As can been see from FIG. 2a, an electroless metal layer 8 is deposited onto the upper face of the complementary S-layer 6 instead of a ligand. The thickness of this metal layer is approximately 20 to 100 nm. Using the concluding etch step depicted in FIG. 2b, e.g. a reactive-ion etch process in oxygen plasma, structuring the substrate surface can again be obtained according to the structured S-layer. This structuring generally serves as further processing of the substrate, likewise as that of FIG. 1e, e.g. semiconductor processing by metallisation, ionic implantation, oxidisation, epitaxy, etc.

FIG. 3 depicts a further embodiment variation of the method according to the invention, which can be advantageously applied particularly with irradiation using electron or ion beams. Electron or ion beam irradiation methodology in the structuring of resist layers has a greater depth of penetration in comparation with light, which means one can dispense with the process of smoothly covering the substrate using a planarising step. Accordingly, the S-layer 3 can be applied directly onto the substrate 1, e.g. a silicon wafer. Modification of the S-layer using suitable irradiation and the subsequent processing steps are carried out in an analogous way to the method described above (cf. FIG. 1a to 1e, and 2a, 2b).

A further embodiment variation of this method according to FIGS. 1 to 1e is depicted schematically in FIG. 4. A photo resist 2, for example a Novolack resist, is applied onto the substrate 1, e.g. a silicon wafer, and an S-layer is deposited onto the upper surface of the photo resist 2.

The S-layer 3 is subsequently exposed to UV radiation with a wavelength of 193 nm (=wave length of an ArF excimer laser), for example by means of a suitable lithographic device and mask. The energy of the short-wave UV rays is sufficient to break up the bonds of the proteins in the crystalline formation of the S-layer 3 and/or the hydrophobic bonds of the S-layer 3 to the photo resist 2 positioned below it, so that the S-layer 3 is ablated at the exposed regions 4. The S-layer remains intact in the unexposed regions 5 on the upper face of the photo resist 2. In practice the ablation is performed already with one short laser pulse, with for example an intensity of 70 mJ/cm$^2$, so that the photo resist 2 below it is only marginally exposed.

In the next step, which is depicted in FIG. 4b, the whole upper face of the substrate 1 is exposed to short-wave UV radiation with a wavelength of 248 nm (=the wavelength of a KrF excimer laser). Due to the lower energy of these rays the binding energies in the crystalline formation of the S-layer 3 can not be overcome, so that ablation of the remaining S-layer 3 is not made possibly. The S-layer 3 thus acts as a mask to expose the photo resist 2. The photo resist 2 is developed after exposure in the usual manner, creating the structures depicted in FIG. 4c, in which the structures of the S-layer 3 are transferred onto the surface of the substrate. By selecting suitable radiation energies this method can naturally be realised using electron or ion beams. In order to safely prevent exposure of the S-layer and the regions of the planarising layer below this S-layer, alternatively the structured S-layer can be reinforced by selective deposition or intercalation of a substance, e.g. a metal (cf. FIG. 2a), prior to the processing step shown in FIG. 4b.

A further option for the application of S-layer technology according to the invention is depicted in FIGS. 5a, 5b. Here again, a monolayer of a crystalline S-layer 3 is deposited onto the substrate 1, e.g. a semiconductor substrate. This layer is structured by radiation, e.g. applying ion or electron beams, in a way such that the S-layer actually remains in its entirety on the substrate surface, but is modified in the structured areas. In the subsequent deposition or intercalation of a functional molecule 9 in the lattice structure of the S-layer (FIG. 5b), only those sites are occupied which were not modified by the radiation. According to this principle, a simple method of fabricating a predefined structure of a functional molecule, e.g. enzymes, antibodies, ligands, in the submicrometre field with a predefined density is offered. This type of structure can be applied in a variety of uses in the field of supramolecular engineering, for example biosensors, immunoassays, affinity structuring, diagnostic test systems, etc.

A further variant of structuring an S-layer for the selective deposition or intercalation of functional molecules is described in the following referring to FIGS. 6a and 6b. In this variant, a structured substrate is fabricated initially, for example an SiO$_2$-coated silicon wafer, which is lithographically structured, e.g. using photon, x-ray, electron or ion beam lithography. The surfaces of the SiO$_2$ structures and the surface of the clean, non oxidised Si-wafer differ from each other fundamentally in their hydrophobicity. The clean Si-surface is hydrophilic, in contrast to the oxide surface, which is hydrophobic. On account of the specific characteristics of S-layers in relation to their deposition onto planar substrate surfaces, namely a preferential deposition on hydrophobic surfaces, the structure depicted in FIG. 6b results from recrystallisation of cell surface proteins, in which the S-layer is only deposited on top of the SiO$_2$ layer, however not on top of the Si-surface. This method of patterning S-layers by means of the different hydrophobicity of defined substrate surface regions can, in principle, be applied to any conceivable surface combination which has sufficient variance in their hydrophobicity. Possible applications of such structured S-layers incorporate the whole field of supramolecular engineering.

By selecting a suitable substrate and by irradiation using suitable radiation, it is, furthermore, possible to structure the substrate surface with respect to the different hydrophobicity by exposure of predefined regions of the substrate upper face. Accordingly the preferential deposition of S-layers can be performed without having to structure a layer of another substance. For example alteration of the hydrophobic surface characteristics of a silicon wafer using ionising radiation beams, for example hydrogen or helium ions, can be observed during exposure.

What is claimed is:

1. A method of producing a structured layer of defined functional molecules on the upper face of a sheet substrate, characterised in that on the upper face of the substrate structures are produced with different surface characteristics at least in relation to their hydrophobicity, in that a monolayer of protein-containing crystalline cell surface layer (S-layer) is deposited by recrystallisation on this structured surface, wherein the S-layer is only deposited at the structured regions of the surface with increased hydrophobicity, and in that the functional molecules are deposited or intercalated at the surface or into the interspaces of the crystal lattice of the S-layer.

2. A method according to claim 1, characterised in that the surface of a substrate is divided into hydrophobic areas on the one hand and hydrophilic areas on the other, by coating this substrate and structuring this coating by removing the coating in predefined regions, wherein the subsequent deposition of the S-layer by recrystallisation is performed on the hydrophobic areas.

3. A method according to claim 1, characterised in that the surface of a substrate is structured into regions with hydrophobic properties and regions with hydrophilic properties by exposure to radiation with predefined intensity and energy, for example masked ion radiation, wherein the subsequent deposition of the S-layer by recrystallisation is only performed in the hydrophobic areas of the substrate surface.

4. A method according to claim 2, characterised in that the substrate is a silicon wafer with an oxide layer structured by removing predefined regions, and the silicon surface of these regions is transferred into an hydrophilic state, whereas those regions with the oxide layer remain in the hydrophobic state and provide for deposition of the S-layer.

5. The method of claim 4 characterized in that the transfer of the silicon surface into an hydrophilic state is accomplished using the RCA-cleaning method.

* * * * *

UNITED STATES PATENT AND TRADEMARK OFFICE
CERTIFICATE OF CORRECTION

PATENT NO. : 6,296,700 B1
DATED : October 2, 2001
INVENTOR(S) : Sleytr et al.

It is certified that error appears in the above-identified patent and that said Letters Patent is hereby corrected as shown below:

<u>Title page,</u>
Item "[73] Assignee: IMS-Ionen Mikrofabrikations Systems GmbH, Vienna (AT)", it should read as folllows:
-- [73] Assignee: IMS-Ionen Mikrofabrikations Systems GmbH, Vienna (AT) part interest --

Signed and Sealed this

Twenty-seventh Day of August, 2002

Attest:

Attesting Officer

JAMES E. ROGAN
*Director of the United States Patent and Trademark Office*